United States Patent
Bai et al.

(10) Patent No.: US 9,917,233 B2
(45) Date of Patent: Mar. 13, 2018

(54) LIGHT EMITTING DIODE PACKAGE STRUCTURE, BACKLIGHT MODULE AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Ling Bai, Beijing (CN); Zhanchang Bu, Beijing (CN); Hetao Wang, Beijing (CN); Kun Lu, Beijing (CN); Kai Yan, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 358 days.

(21) Appl. No.: 14/422,141

(22) PCT Filed: Aug. 1, 2014

(86) PCT No.: PCT/CN2014/083570
§ 371 (c)(1),
(2) Date: Feb. 17, 2015

(87) PCT Pub. No.: WO2015/085780
PCT Pub. Date: Jun. 18, 2015

(65) Prior Publication Data
US 2016/0035946 A1    Feb. 4, 2016

(30) Foreign Application Priority Data
Dec. 13, 2013    (CN) .......................... 2013 1 0684966

(51) Int. Cl.
*F21V 7/04*    (2006.01)
*H01L 33/54*    (2010.01)
(Continued)

(52) U.S. Cl.
CPC .............. *H01L 33/54* (2013.01); *G02B 6/002* (2013.01); *G02B 6/0073* (2013.01);
(Continued)

(58) Field of Classification Search
USPC ......................................................... 362/612
See application file for complete search history.

(56) References Cited

U.S. PATENT DOCUMENTS

2011/0285269 A1*    11/2011    Adachi ............... H01L 27/3246
                                                                                                      313/113

FOREIGN PATENT DOCUMENTS

CN      201487746 U      5/2010
CN      103700754 A      4/2014
(Continued)

OTHER PUBLICATIONS

First Office Action regarding Chinese application No. 201310684966.7, dated Oct. 28, 2015. Translation provided by Dragon Intellectual Property Law Firm.
(Continued)

*Primary Examiner* — Rafferty Kelly
(74) *Attorney, Agent, or Firm* — Harness, Dickey & Pierce, P.L.C.

(57) ABSTRACT

The present disclosure provides a light emitting diode (LED) package structure, a backlight module and a display device, and relates to the field of display technologies. The LED package structure includes an encapsulation housing and an LED chip encapsulated in the encapsulation housing. The encapsulation housing is a polyhedron which includes at least one inclined plane. One inclined plane of the encapsulation housing is a light exiting surface of the LED package structure.

15 Claims, 5 Drawing Sheets

(51) Int. Cl.
*F21V 8/00* (2006.01)
*H01L 33/48* (2010.01)
(52) U.S. Cl.
CPC .......... *G02B 6/0091* (2013.01); *H01L 33/483* (2013.01); *H01L 2224/45144* (2013.01); *H01L 2224/48091* (2013.01); *H01L 2224/73265* (2013.01)

(56) References Cited

FOREIGN PATENT DOCUMENTS

| | | | |
|---|---|---|---|
| JP | 2010135547 | A | 6/2010 |
| KR | 20110001079 | A | 1/2011 |
| TW | 201314978 | A | 4/2013 |

OTHER PUBLICATIONS

Written Opinion of the International Searching Authority for international application No. PCT/CN2014/083570.
Third Office Action regarding Chinese application No. 201310684966.7, dated Aug. 23, 2016. Translation provided by Dragon Intellectual Property Law Firm.
Second Office Action regarding Chinese application No. 201310684966.7, dated Apr. 19, 2016. Translation provided by Dragon Intellectual Property Law Firm.

* cited by examiner

LIGHT EMITTING DIODE PACKAGE STRUCTURE, BACKLIGHT MODULE AND DISPLAY DEVICE

CROSS-REFERENCE TO RELATED APPLICATION APPLICATIONS

This application is the U.S. national phase of PCT Application No. PCT/CN2014/083570 filed on Aug. 1, 2014, which claims a priority of the Chinese patent application No. 201310684966.7 filed on Dec. 13, 2013, the disclosures of which are incorporated herein by reference in theft entirety.

TECHNICAL FIELD

The present disclosure relates to a backlight source of a liquid crystal display, and more particularly to a light emitting diode (LED) package structure of a backlight source, a backlight module and a display device.

BACKGROUND

Figure 1:
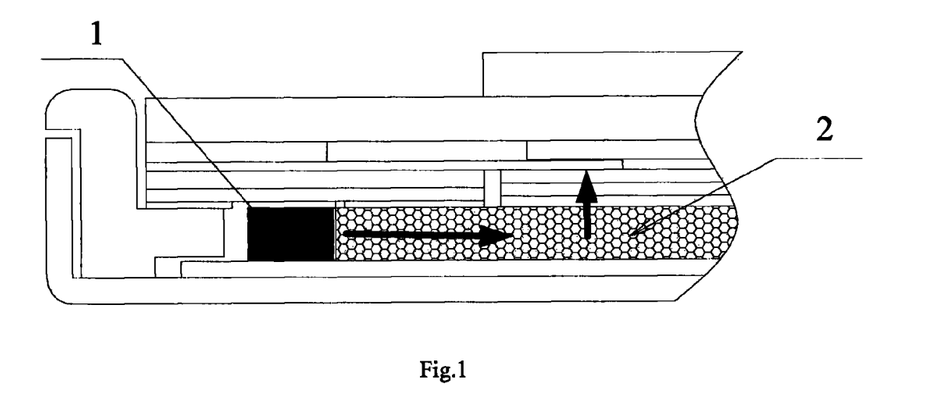
FIG. 1 is a schematic diagram showing a basic structure of a liquid crystal display module in the related art.

Currently, in a side-type backlight source of a liquid crystal display device, a light emitting diode (LED) package structure 1 is located on a lateral side of a light guide plate (LGP) 2. The LED package structure 1 is a package structure having a rectangular appearance. A light emitting direction of the LED package structure 1 is perpendicular to a light emitting direction of the light guide plate 2. Referring to FIG. 1, an arrow in a horizontal direction represents the light emitting direction of the LED package structure 1, while an arrow in a vertical direction represents the light emitting direction of the light guide plate 2.

Figure 2:
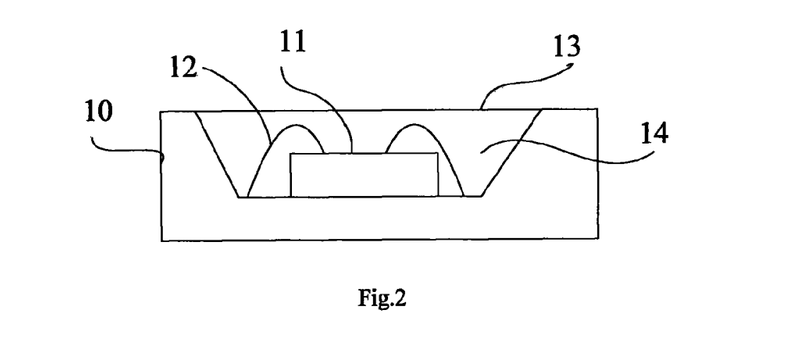
FIG. 2 is a schematic diagram showing a structure of a light emitting diode package structure in the related art.
Figure 3:
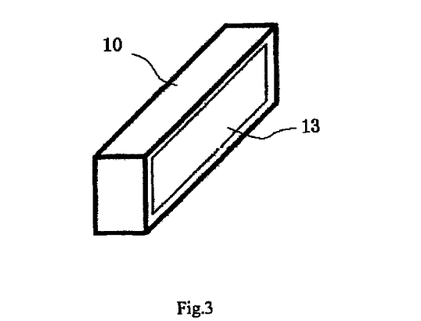
FIG. 3 is a schematic diagram showing a three-dimensional structure of the light emitting diode package structure shown in FIG. 2.

Referring to FIG. 2 and FIG. 3, an existing LED package structure includes a rectangular housing 10, an LED chip 11 encapsulated in the rectangular housing 10 and gold wires 12 connected with the LED chip 11. A surface of the rectangular housing 10 facing the LED chip 11 is a light exiting surface 13. Silica gel and phosphor 14 are further encapsulated in the rectangular housing 10 between the LED chip 11 and the light exiting surface 13, so that the phosphor is excited by blue light generated by the chip to produce white light.

In the process of implementing the present disclosure, inventors discovers that the existing LED package structure having a rectangular appearance has a larger volume but has a smaller light exiting surface, which is not benefit to realize thin backlight modules.

SUMMARY

One technical problem to be solved by the present disclosure is to provide a light emitting diode package structure, a backlight module and a display device, the light emitting diode package has a smaller volume and a larger light exiting surface.

In order to solve the above technical problem, one embodiment of the present disclosure provides a light emitting diode package structure adopting following technical solution.

A light emitting diode (LED) package structure includes an encapsulation housing and an LED chip encapsulated in the encapsulation housing; the encapsulation housing is a polyhedron which includes at least one inclined plane; one inclined plane of the encapsulation housing is a light exiting surface of the LED package structure.

Optionally, the encapsulation housing includes a first surface and a second surface which are triangular and arranged parallel to each other, as well as a first side surface, a second side surface and a third side surface connecting the first surface to the second surface; the first side surface, the second side surface or the third side surface is the light exiting surface of the LED package structure.

Optionally, the first surface and the second surface of the encapsulation housing have isosceles right triangle shapes; a surface, where a hypotenuse of the isosceles right triangle is located, is the light exiting surface of the LED package structure.

Optionally, a light emitting direction of the LED chip is perpendicular to the light exiting surface of the LED package structure.

Optionally, the encapsulation housing further includes a strengthening portion provided in a plane where at least one right-angle side of the isosceles right triangle is located.

Optionally, the strengthening portion and the encapsulation housing are an integral structure.

One embodiment of the present disclosure further provides a backlight module including the above LED package structure.

Optionally, the backlight module further includes a light guide plate; a light incident surface of the light guide plate matches with the light exiting surface of the LED package structure.

Optionally, the light guide plate includes a top surface and a bottom surface parallel to the top surface, as well as four lateral surfaces; at least one lateral surface of the light guide plate is an inclined plane.

Optionally, an angle defined between the inclined plane of the light guide plate and the bottom surface of the light guide plate is an acute angle; the inclined plane of the light guide plate is the light incident surface of the light guide plate; the top surface of the light guide plate is a light exiting surface of the light guide plate; the LED package structure is provided on the inclined plane of the light guide plate; the light emitting direction of the LED package structure is perpendicular to the light incident surface of the light guide plate.

One embodiment of the present disclosure further provides a display device including the above backlight module.

The above technical solution of the present disclosure has following beneficial effects.

In the above respective solutions, comparing with the LED package structure of a cuboid structure in the related art, since the encapsulation housing in the LED package structure of one embodiment of the present disclosure is a polyhedron which includes at least one inclined plane and one inclined plane of the encapsulation housing is a light exiting surface of the LED chip, thus, the LED package structure of the present disclosure has a smaller volume and a larger light exiting surface. In the backlight module of one embodiment of the present disclosure, since at least one lateral surface of the light guide plate is an inclined plane, the light emitting direction of the light source is perpendicular to the inclined plane of the light guide plate, this helps to alleviate the hotspot phenomenon (the hotspot phenomenon is a phenomenon that when adopting an LED as a backlight source, there are alternated bright and dark light in a light incident part of the backlight source), increase luminous flux in the light emitting direction of the light guide plate and improve the light energy utilization rate.

DETAILED DESCRIPTION

In order to make the technical problem to be solved by the present disclosure, technical solutions and advantage of the present disclosure apparent, detailed description will be given hereinafter in conjunction with the drawings and embodiments.

Figure 4:
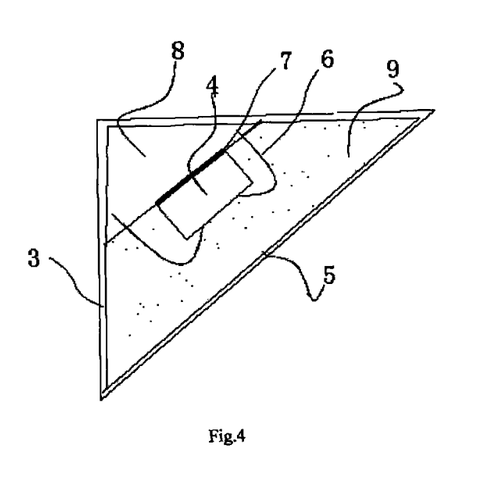
FIG. 4 is a schematic diagram showing a structure of a light emitting diode package structure according to one embodiment of the present disclosure.
Figure 5:
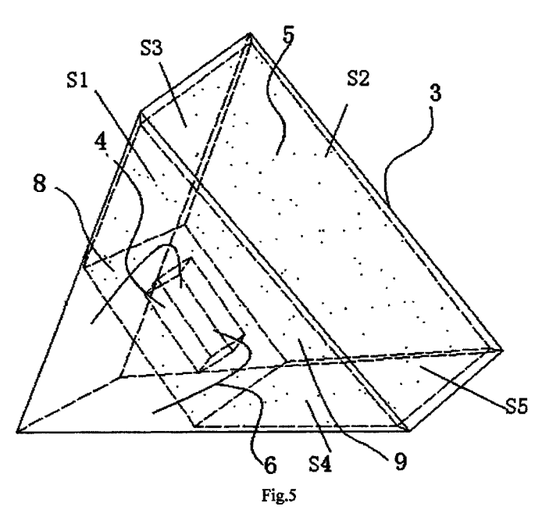
FIG. 5 is a schematic diagram showing a three-dimensional structure of the light emitting diode package structure shown in FIG. 4.

As shown in FIG. 4 and FIG. 5, in one embodiment of the present disclosure, a light emitting diode (LED) package structure includes an encapsulation housing 3 and an LED chip 4 encapsulated in the encapsulation housing 3. The encapsulation housing 3 is a polyhedron which includes at least one inclined plane. One inclined plane 5 of the encapsulation housing 3 is a light exiting surface of the LED package structure.

In the LED package structure of one embodiment of the present disclosure, since the encapsulation housing 3 is a polyhedron which includes at least one inclined plane and one inclined plane 5 of the encapsulation housing 3 is a light exiting surface of the LED package structure, the LED package structure of one embodiment of the present disclosure has a smaller volume and a larger light exiting surface.

In the above embodiment, the LED chip 4 is connected with gold wires 6, and the LED chip 4 is secured on a heat sink 8 located in the encapsulation housing 3 by a die bonding glue 7. Silica gel and phosphor 9 are encapsulated between the LED chip 4 and the light exiting surface, so that the phosphor is excited by blue light generated by the LED chip to produce white light.

Referring to FIG. 5, in order to facilitate arranging the LED package structure on a lateral side of the light guide plate, optionally, the encapsulation housing includes a first surface S1 and a second surface S2 which are triangular and arranged parallel to each other, as well as a first side surface S3, a second side surface S4 and a third side surface S5 connecting the first surface to the second surface. The first side surface, the second side surface or the third side surface is the light exiting surface of the LED package structure.

Optionally, the first surface and the second surface of the encapsulation housing have isosceles right triangle shapes. A surface, where a hypotenuse of the isosceles right triangle is located, is the light exiting surface of the LED package structure.

In the above embodiment, optionally, the light exiting direction of the LED chip 4 is perpendicular to the light exiting surface 5. The light exiting direction may be a direction in which light intensity of emitted light is maximum, and this helps to increase luminous flux through the light exiting surface 5 and improve the light energy utilization rate.

Figure 6:
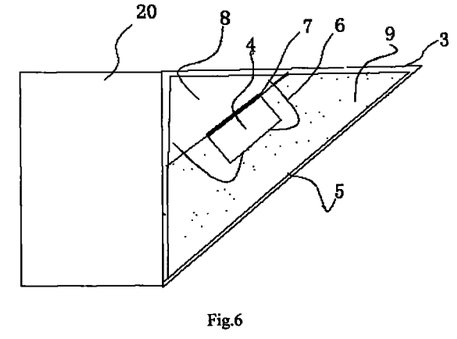
FIG. 6 is a schematic diagram showing a structure of a light emitting diode package structure according to another embodiment of the present disclosure.

Referring to FIG. 6, in order to increase strength of the entire LED package structure, a strengthening portion 20 is further provided in a plane where at least one right-angle side of the isosceles right triangle is located. When the LED package structure of one embodiment of the present disclosure is installed on a lateral side of a light guide plate of a backlight module, the strengthening portion 20 also helps to provide a stable support for the LED package structure. Optionally, the strengthening portion 20 and the encapsulation housing 3 may be an integral structure.

Figure 7:
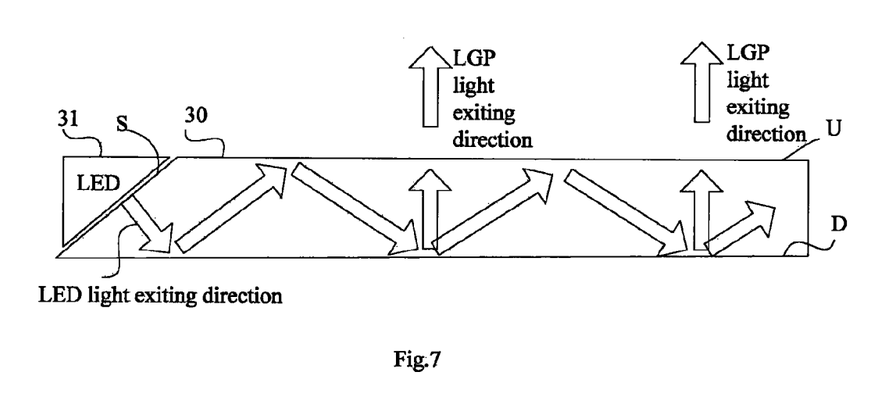
FIG. 7 is a schematic diagram showing a model of a light emitting direction of a light emitting diode package structure in a backlight module according to one embodiment of the present disclosure.

Referring to FIG. 7, one embodiment of the present disclosure further provides a backlight module, including the LED package structure of the above embodiment. Specifically, the backlight module includes a light guide plate 30. A light incident surface of the light guide plate 30 matches with the light exiting surface of the LED package structure 31. Optionally, as shown in FIG. 7, the light guide plate includes a top surface U and a bottom surface D parallel to the top surface U, as well as four lateral surfaces S. At least one lateral surface S of the light guide plate is an inclined plane. An angle defined between the inclined plane S and the bottom surface D of the light guide plate 30 is an acute angle. The inclined plane S of the light guide plate 30 is the light incident surface of the light guide plate 30. The top surface U of the light guide plate is a light exiting surface of the light guide plate. The LED package structure 31 is provided on the inclined plane of the light guide plate. The light exiting direction of the LED package structure is perpendicular to the light incident surface of the light guide plate.

Figure 8:
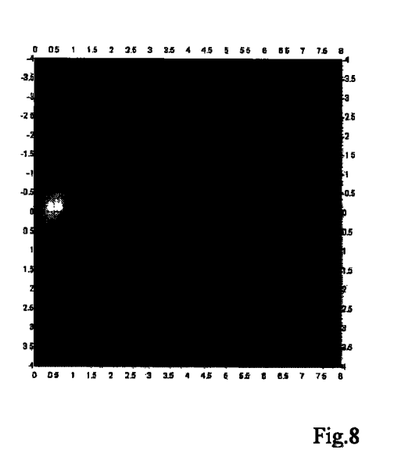
FIG. 8 is a schematic diagram showing a (smaller) hotspot phenomenon in the backlight module according to one embodiment of the present disclosure.
Figure 9:
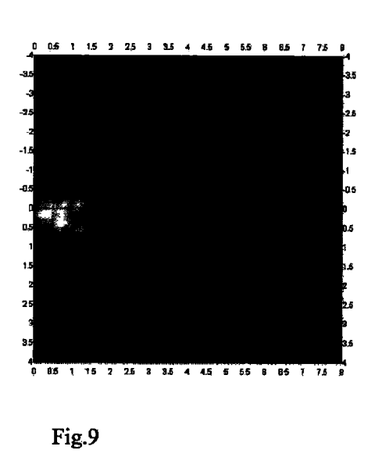
FIG. 9 is a schematic diagram showing a (bigger) hotspot phenomenon in the related art.

Referring to FIG. 1, in the current backlight source of the liquid crystal display, the light exiting direction of the LED is perpendicular to the light exiting direction of the light guide plate. The light exiting direction of the light guide plate determines a light exiting direction of the entire liquid crystal display module. However, Lambert type light-emitting curve of the LED source determines that the luminous flux in the light exiting direction occupies a larger proportion, thus, the hotspot phenomenon tends to occur on positions where the light exiting surface of the light guide plate contacts the LED package structure. Referring to FIG. 7, in the backlight module of one embodiment of the present disclosure, the angle defined between the light exiting direction of the light source and the bottom surface D of the light guide plate is an acute angle, i.e., the light exiting direction travels towards the bottom surface D of the light guide plate; on the one hand, luminous flux in the positions where the light exiting surface of the light guide plate contacts the LED package structure is smaller, thereby alleviating the hotspot phenomenon; on the other hand, the luminous flux in the light exiting direction of the light guide plate may be improved and thus the light energy utilization rate is improved. FIG. 8 is a schematic diagram showing a (smaller) hotspot phenomenon in the backlight module according to one embodiment of the present disclosure; FIG. 9 is a schematic diagram showing a (bigger) hotspot phenomenon in the related art.

In the backlight module of one embodiment of the present disclosure, the light source 31 includes an LED package structure. Referring to FIG. 4 and FIG. 5, the LED package structure includes an encapsulation housing 3 and an LED chip 4 encapsulated in the encapsulation housing 3. The encapsulation housing 3 is a polyhedron which includes at least one inclined plane. One inclined plane 5 of the encapsulation housing 3 is a light exiting surface of the LED package structure. The inclined plane 5 of the encapsulation housing 3 matches with the inclined plane S on a lateral side of the light guide plate 30.

In the LED package structure of one embodiment of the present disclosure, since the encapsulation housing 3 is a polyhedron which includes at least one inclined plane and one inclined plane 5 of the encapsulation housing 3 is a light exiting surface of the LED package structure, the LED package structure of one embodiment of the present disclosure has a smaller volume and a larger light exiting surface.

The LED package structure in the backlight module of one embodiment of the present disclosure may adopt structures of any LED package structure of the above embodiments of the present disclosure, which will not be repeated here.

Figure 10:
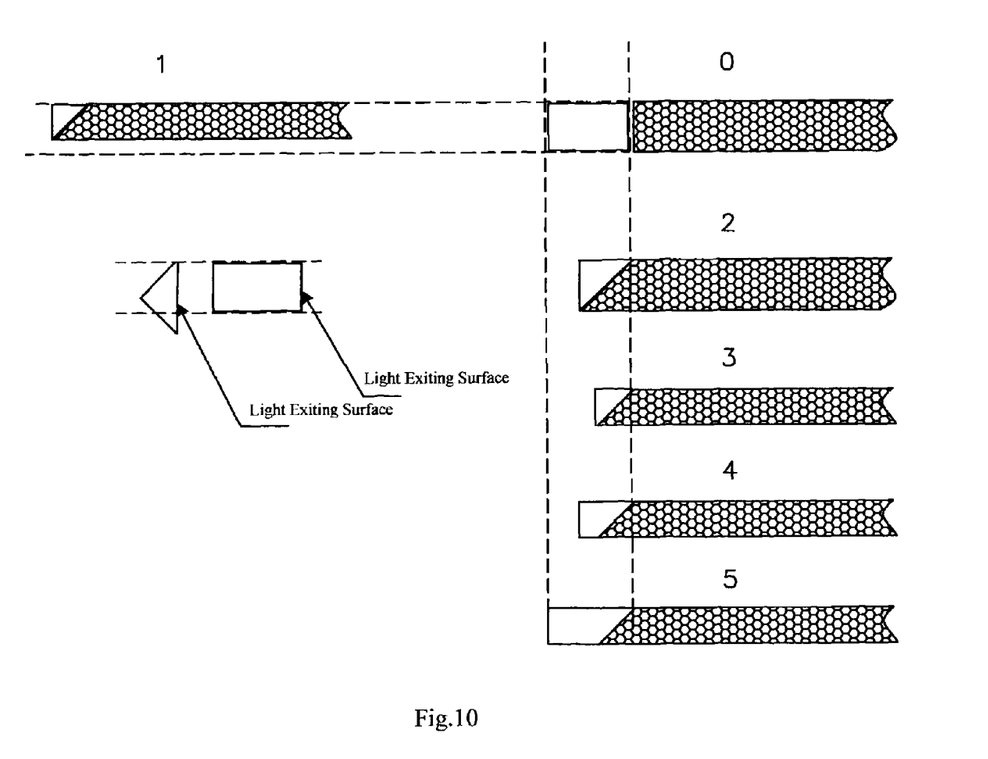
FIG. 10 is a schematic diagram showing a comparison of the backlight module according to one embodiment of the present disclosure and a backlight module in the related art.

Since the backlight module of one embodiment of the present disclosure adopts triangular LED package structure, requirements of a thin liquid crystal display module with a narrow frame may be met. FIG. 10 is a schematic diagram showing a comparison of the backlight module according to one embodiment of the present disclosure and a backlight module in the related art. As shown in FIG. 10, the structure 0 is an existing structure. On the basis that a thickness of a light guide plate of the structure 0 is unchanged, the design of the inclined angle of the light exiting surface of the LED, for example, the structure 2, may effectively increase a light exiting area of the LED, improve light energy utilization rate, and reduce an edge width of the entire module at the same time. On the basis that the light exiting surface of the LED of the structure 0 is unchanged, the design of the inclined angles of the LED and the light guide plate, for example, the structures 1 and 3, design requirements of a thin module with a narrow frame may be meet. On the basis of the structure 3, on the premise of acceptable frame thickness, the LED may be thicker and reinforced, for example, structures 4 and 5.

In the LED package structure of one embodiment of the present disclosure, since the encapsulation housing is a polyhedron which includes at least one inclined plane and one inclined plane of the encapsulation housing is a light exiting surface of the LED package structure, thus, the LED package structure of one embodiment of the present disclosure and the backlight module adopting the LED package structure have a smaller volume and a larger light exiting surface. Meanwhile, the hotspot phenomenon may also be alleviated, luminous flux in the light exiting direction of the light guide plate may be improved and thus the light energy utilization rate is improved.

Those described above are optional embodiments of the present disclosure. It should be noted, for those skilled in the art, improvements and substitutions may also be made without departing from the principle of the present disclosure. Those improvements and substitutions should also be considered as the scope of the present disclosure.

What is claimed is:

1. A backlight module comprising:
    a light emitting diode (LED) package structure, the LED package structure comprising an encapsulation housing and an LED chip encapsulated in the encapsulation housing, wherein:
    the encapsulation housing is a polyhedron which comprises at least one inclined plane, one inclined plane of the encapsulation housing is a light exiting surface of the LED package structure,
    the backlight module further comprises a light guide plate, a light incident surface of the light guide plate matches with the light exiting surface of the LED package structure, and
    the light guide plate comprises a top surface and a bottom surface parallel to the top surface, as well as four lateral surfaces, at least one lateral surface of the light guide plate is an inclined plane,
    wherein an angle defined between the inclined plane of the light guide plate and the bottom surface of the light guide plate is an acute angle; the inclined plane of the light guide plate is the light incident surface of the light guide plate; the top surface of the light guide plate is a light exiting surface of the light guide plate; the LED package structure is provided on the inclined plane of the light guide plate; the light exiting direction of the LED package structure is perpendicular to the light incident surface of the light guide plate.

2. A display device comprising the backlight module according to claim 1.

3. The backlight module according to claim 1, wherein the encapsulation housing comprises a first surface and a second surface which are triangular and arranged parallel to each other, as well as a first side surface, a second side surface and a third side surface connecting the first surface to the second surface; the first side surface, the second side surface or the third side surface is the light exiting surface of the LED package structure.

4. The backlight module according to claim 3, wherein the first surface and the second surface of the encapsulation housing have isosceles right triangle shapes;
    a surface, where a hypotenuse of the isosceles right triangle is located, is the light exiting surface of the LED package structure.

5. The backlight module according to claim 4, wherein a light exiting direction of the LED chip is perpendicular to the light exiting surface of the LED package structure.

6. The backlight module according to claim 5, wherein the encapsulation housing further comprises a strengthening portion provided in a plane where at least one right-angle side of the isosceles right triangle is located.

7. The backlight module according to claim 6, wherein the strengthening portion and the encapsulation housing are an integral structure.

8. A display device including a backlight module, the backlight module comprising:
    a light emitting diode (LED) package structure, the LED package structure comprising an encapsulation housing and an LED chip encapsulated in the encapsulation housing, wherein:
    the encapsulation housing is a polyhedron which comprises at least one inclined plane, one inclined plane of the encapsulation housing is a light exiting surface of the LED package structure, the backlight module further comprises a light guide plate, a light incident surface of the light guide plate matches with the light exiting surface of the LED package structure, and the light guide plate comprises a top surface and a bottom surface parallel to the top surface, as well as four lateral surfaces, at least one lateral surface of the light guide plate is an inclined plane, wherein the encapsulation housing comprises a first surface and a second surface which are triangular and arranged parallel to each other, as well as a first side surface, a second side surface and a third side surface connecting the first surface to the second surface; the first side surface, the second side surface or the third side surface is the light exiting surface of the LED package structure, wherein the first surface and the second surface of the encapsulation housing have isosceles right triangle shapes; a surface, where a hypotenuse of the isosceles right triangle is located, is the light exiting surface of the LED package structure, and wherein a light exiting direction of the LED chip is perpendicular to the light exiting surface of the LED package structure.

9. The display device according to claim 8, wherein the encapsulation housing further comprises a strengthening portion provided in a plane where at least one right-angle side of the isosceles right triangle is located.

10. The display device according to claim 9, wherein the strengthening portion and the encapsulation housing are an integral structure.

11. The display device according to claim 8, wherein an angle defined between the inclined plane of the light guide plate and the bottom surface of the light guide plate is an acute angle.

12. The display device according to claim 11, wherein the inclined plane of the light guide plate is the light incident surface of the light guide plate.

13. The display device according to claim 12, wherein the top surface of the light guide plate is a light exiting surface of the light guide plate.

14. The display device according to claim 13, wherein the LED package structure is provided on the inclined plane of the light guide plate.

15. The display device according to claim 13, the light exiting direction of the LED package structure is perpendicular to the light incident surface of the light guide plate.

* * * * *